(12) United States Patent
Flynn et al.

(10) Patent No.: US 8,698,286 B2
(45) Date of Patent: *Apr. 15, 2014

(54) HIGH VOLTAGE SWITCHING DEVICES AND PROCESS FOR FORMING SAME

(71) Applicant: Cree, Inc., Durham, NC (US)

(72) Inventors: Jeffrey S. Flynn, Wake Forest, NC (US); George R. Brandes, Raleigh, NC (US); Robert P. Vaudo, Cary, NC (US)

(73) Assignee: Cree, Inc., Durham, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/765,294

(22) Filed: Feb. 12, 2013

(65) Prior Publication Data

US 2013/0193444 A1 Aug. 1, 2013

Related U.S. Application Data

(60) Continuation of application No. 13/428,039, filed on Mar. 23, 2012, now Pat. No. 8,390,101, which is a division of application No. 12/852,223, filed on Aug. 6, 2010, now Pat. No. 8,174,089, which is a division of application No. 10/513,009, filed as application No. PCT/US03/13162 on Apr. 30, 2003, now Pat. No. 7,795,707.

(60) Provisional application No. 60/376,629, filed on Apr. 30, 2002.

(51) Int. Cl.
*H01L 29/20* (2006.01)

(52) U.S. Cl.
USPC .................. 257/656; 257/194; 257/E29.246

(58) Field of Classification Search
USPC ................... 257/656, 194, E29.246
See application file for complete search history.

(56) References Cited

U.S. PATENT DOCUMENTS

| 5,451,797 A | 9/1995 | Davis et al. |
| 5,578,839 A | 11/1996 | Nakamura et al. |
| 5,635,732 A | 6/1997 | Davis et al. |
| 5,679,152 A | 10/1997 | Tischler et al. |

(Continued)

FOREIGN PATENT DOCUMENTS

| JP | 09-275217 A | 10/1997 |
| JP | 2001-060719 A | 3/2001 |

(Continued)

OTHER PUBLICATIONS

Bandic, Z. et al, High Voltage GaN Schottky Rectifiers, Applied Physics Letters, Mar. 1, 1999, pp. 1266-1268, vol. 74, No. 9.

(Continued)

*Primary Examiner* — Eugene Lee
(74) *Attorney, Agent, or Firm* — Vincent K. Gustafson; Jenkins, Wilson, Taylor & Hunt, P.A.

(57) ABSTRACT

The present invention relates to various switching device structures including Schottky diode, P-N diode, and P-I-N diode, which are characterized by low defect density, low crack density, low pit density and sufficient thickness (>2.5 um) GaN layers of low dopant concentration (<1E16 $cm^{-3}$) grown on a conductive GaN layer. The devices enable substantially higher breakdown voltage on hetero-epitaxial substrates (<2 KV) and extremely high breakdown voltage on homo-epitaxial substrates (>2 KV).

29 Claims, 9 Drawing Sheets

(56) References Cited

U.S. PATENT DOCUMENTS

| | | | |
|---|---|---|---|
| 5,786,606 | A | 7/1998 | Nishio et al. |
| 5,810,925 | A * | 9/1998 | Tadatomo et al. ............ 117/90 |
| 5,874,747 | A | 2/1999 | Redwing et al. |
| 5,929,466 | A | 7/1999 | Ohba et al. |
| 6,043,105 | A | 3/2000 | Yamazaki |
| 6,110,757 | A | 8/2000 | Udagawa |
| 6,150,674 | A | 11/2000 | Yuri et al. |
| 6,156,581 | A | 12/2000 | Vaudo et al. |
| 6,194,742 | B1 | 2/2001 | Kern et al. |
| 6,291,366 | B1 | 9/2001 | Sano et al. |
| 6,316,793 | B1 | 11/2001 | Sheppard et al. |
| 6,325,850 | B1 | 12/2001 | Beaumont et al. |
| 6,380,051 | B1 | 4/2002 | Yuasa et al. |
| 6,423,984 | B1 * | 7/2002 | Kato et al. ............ 257/103 |
| 6,429,467 | B1 | 8/2002 | Ando |
| 6,440,823 | B1 | 8/2002 | Vaudo et al. |
| 6,447,604 | B1 | 9/2002 | Flynn et al. |
| 6,468,347 | B1 * | 10/2002 | Motoki et al. ............ 117/89 |
| 6,492,669 | B2 | 12/2002 | Nakayama et al. |
| 6,548,333 | B2 | 4/2003 | Smith |
| 6,580,101 | B2 | 6/2003 | Yoshida |
| 6,593,159 | B1 | 7/2003 | Hashimoto et al. |
| 6,639,255 | B2 | 10/2003 | Inoue et al. |
| 6,690,035 | B1 | 2/2004 | Yokogawa et al. |
| 6,765,240 | B2 | 7/2004 | Tischler et al. |
| 6,936,357 | B2 * | 8/2005 | Melnik et al. ............ 428/698 |
| 6,943,095 | B2 | 9/2005 | Vaudo et al. |
| 7,795,707 | B2 | 9/2010 | Flynn et al. |
| 8,174,089 | B2 | 5/2012 | Flynn et al. |
| 8,390,101 | B2 | 3/2013 | Flynn et al. |
| 2002/0048964 | A1 | 4/2002 | Yuasa et al. |
| 2002/0127890 | A1 | 9/2002 | Andoh |
| 2002/0166502 | A1 | 11/2002 | Vaudo et al. |
| 2003/0178633 | A1 | 9/2003 | Flynn et al. |
| 2004/0155260 | A1 | 8/2004 | Kuzmik |
| 2005/0167697 | A1 | 8/2005 | Flynn et al. |
| 2005/0191775 | A1 | 9/2005 | Toda et al. |

FOREIGN PATENT DOCUMENTS

| | | |
|---|---|---|
| JP | 2002-50888 A | 3/2002 |
| JP | 2002-093920 A | 3/2002 |
| WO | WO 9837584 A1 | 8/1998 |
| WO | WO 0167521 A1 | 9/2001 |
| WO | WO 0168955 A | 9/2001 |

OTHER PUBLICATIONS

International Search Report issued in International Patent Application No. PCT/US03/13162 dated Sep. 5, 2003.

Japanese 'Questioning' document, issued Feb. 21, 2012 in corresponding Japanese Patent Application No. 2004-502360.

Kudo, Kazuhiro, et al. "Device characteristics of lateral and vertical type organic field effect transistors," Thin Solid Films 393, 2001, pp. 362-367.

Molnar, R et al , "Growth of gallium nitride by hydride vapor-phase epitaxy", "Journal of Crystal Growth", 1997, pp. 147-156, vol. 178.

Nakamura, Shuji, et al, "Si- and Ge-doped GaN films grown with GaN buffer layers", "Jpn. J. Appl. Phys", Sep. 1, 1992, pp. 2883-2888, vol. 31, No. 9A.

Official Action corresponding to European Patent Application No. 10 182 109.8-235 dated Dec. 20, 2012.

Official Action corresponding to European Patent Application No. 10 182 112.2-1235 dated Jan. 31, 2013.

Official Action corresponding to European Patent Application No. 10 182 112.2-1235 dated Feb. 7, 2013.

Sampath, A. V., et al, "GaN photodiodes grown by MBE on HVPE and ELO-HVPE GaN/sapphire substrates", "Proceedings of SPIE", 2000, pp. 311-318, vol. 3948.

Sampath, Anand V., et al, "A comparative study of GaN diodes grown by MBE on sapphire and HVPE-GaN/sapphire substrates", "Mat. Res. Soc. Symp.", 2000, pp. W11.1.1-W11.1.6, vol. 595, Publisher: Materials Research Society.

Trivedi, M. et al , "Performance Evaluation of High-Power Wide Band-Gap Semiconductor Rectifiers", "Journal of Applied Physics", May 1, 1999, pp. 6889-6897, vol. 85, No. 9.

Zhang, Anping P., et al., "Comparison of GaN P-I-N and Schottky Rectifier Performance", "IEEE Transactions on Electron Devices", Mar. 2001, pp. 407-411, vol. 48, No. 3, Publisher: IEEE Service Center, Published in: Pisacataway, NJ.

Zhu, T.G., et al. "High-voltage GaN pin vertical rectifiers with 2 μm thick i-layer," Electronics Letters, IEE Stevenage, GB, vol. 36, No. 23, pp. 1971-1972, Nov. 9, 2000, XP006015891.

* cited by examiner

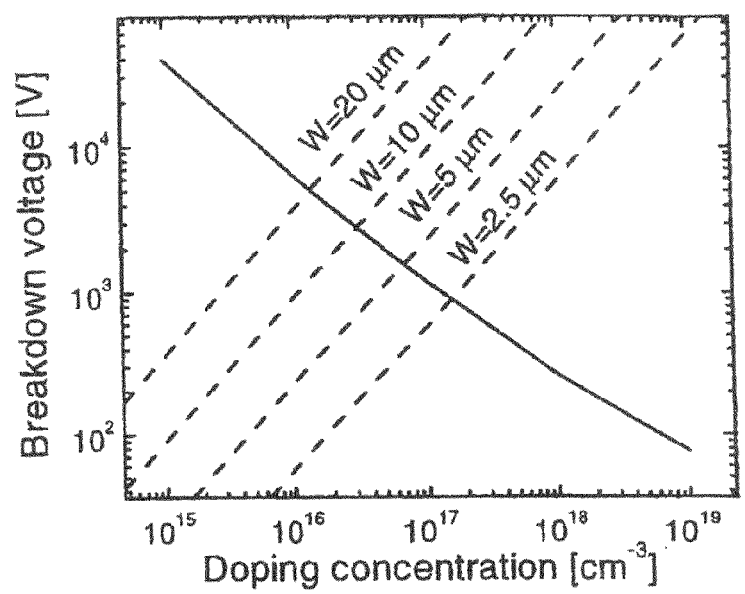
Figure 1
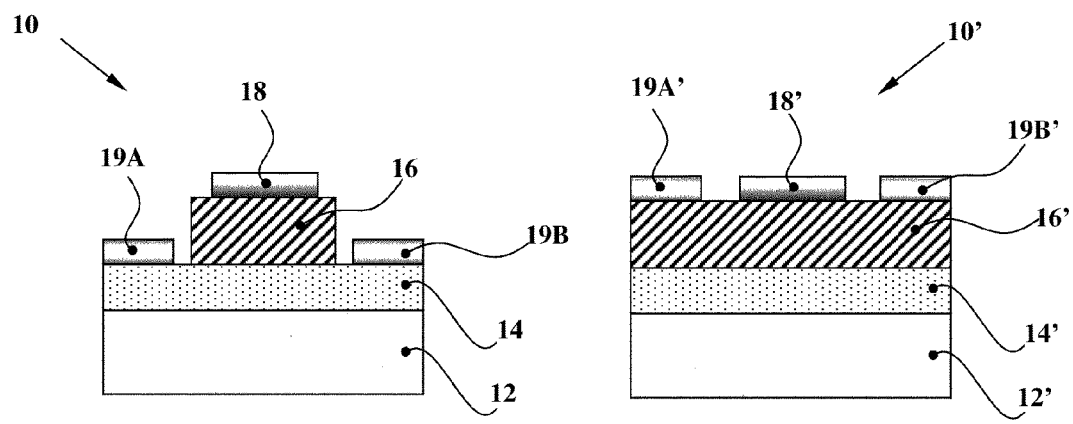
Figure 2A  Figure 2B

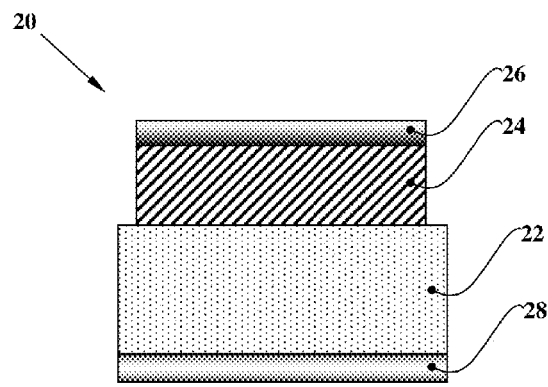
Figure 5
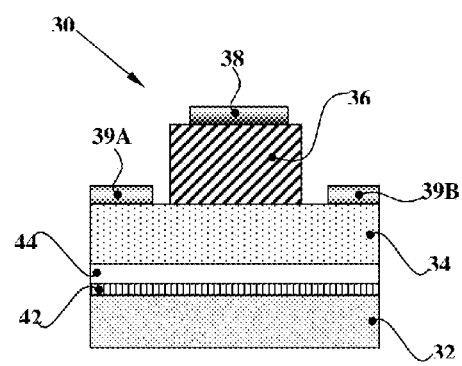 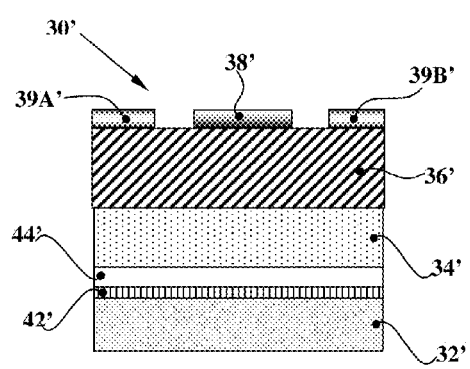
Figure 6A                Figure 6B

HIGH VOLTAGE SWITCHING DEVICES AND PROCESS FOR FORMING SAME

CROSS-REFERENCE TO RELATED APPLICATIONS

This application is a continuation of U.S. patent application Ser. No. 13/428,039 filed on Mar. 23, 2012, and issued as U.S. Pat. No. 8,390,101 on Mar. 5, 2013, which in turn is a divisional of U.S. patent application Ser. No. 12/852,223 filed on Aug. 6, 2010, and issued as U.S. Pat. No. 8,174,089 on May 8, 2012, which in turn is a divisional of U.S. patent application Ser. No. 10/513,009 filed on Oct. 27, 2004, and issued as U.S. Pat. No. 7,795,707 on Sep. 14, 2010, which was filed under the provisions of 35 U.S.C. §371 based on International Patent Application No. PCT/US03/13162 filed on Apr. 30, 2003, which in turn claims priority to U.S. Provisional Application No. 60/376,629 filed on Apr. 30, 2002. The disclosures of each of the foregoing applications and patents are hereby incorporated by reference herein in their respective entireties, for all purposes.

BACKGROUND OF THE INVENTION

1. Field of the Invention

The present invention relates to various switching devices of high breakdown voltage and a process for forming same.

2. Description of the Related Art

By way of background to the present invention, the disclosures of the following documents are hereby incorporated by reference, in their respective entireties:

Brandić et al., "High Voltage (450 V) GaN Schottky Rectifiers," Appl. Phys. Lett., Vol. 74, No. 9, pp. 1266-1268 (Mar. 1, 1999).

Trivedi et al., "Performance Evaluation of High-Power Wide Band-Gap Semiconductor Rectifiers," J. Appl. Phys., Vol. 85, No. 9, pp. 6889-6897 (May 1, 1999).

U.S. Pat. No. 6,156,581 issued Dec. 5, 2000 in the names of Robert P. Vaudo, et al. for "GaN-BASED DEVICES USING THICK (Ga, Al, In)N BASE LAYERS."

U.S. Pat. No. 6,440,823 issued Aug. 27, 2002 in the names of Robert P. Vaudo, et al. for "LOW DEFECT DENSITY (Ga, Al, In)N AND HVPE PROCESS FOR MAKING SAME."

U.S. Pat. No. 6,447,604 issued Sep. 10, 2002 in the names of Jeffrey S. Flynn et al. for "METHOD FOR ACHIEVING IMPROVED EPITAXY QUALITY (SURFACE TEXTURE AND DEFECT DENSITY) ON FREE-STANDING (ALUMINUM, INDIUM, GALLIUM) NITRIDE ((AL,IN,GA)N) SUBSTRATES FOR OPTO-ELECTRONIC AND ELECTRONIC DEVICES."

(Ga,Al,In)N-based materials, which are generically referred to as "GaN" throughout the description of the present invention hereinafter unless specified otherwise, is a promising group of semiconductor materials for fabricating high voltage, high power microelectronic switching devices, which include, but are not limited to, Schottky diode rectifiers, P-N diodes, P-I-N diodes, thyristors with P-N-P-N junctions, and Impact Ionization Avalanche Transit Time devices (IMPATTs) with $N^+$-P-I-$P^+$ junctions, etc.

As shown in Table 1, GaN has a number of fundamental properties that make it advantageous for use in high power switching applications. The wide band gap of GaN gives it a high theoretical breakdown field, comparable to 4H-SiC. In addition, GaN has a higher electron mobility and maximum velocity than 4H-SiC. The thermal conductivity of GaN, while lower than 4H-SiC, is comparable to that of Si, which is currently the most common material used to fabricate high power switching devices.

TABLE 1

300K PROPERTIES OF CANDIDATE MATERIALS

|  | Si | 4H—SiC | GaN |
|---|---|---|---|
| Bandgap (eV) | 1.1 | 3.3 | 3.4 |
| $E_c$, Breakdown field ($10^5$ V/cm) | 2 | 30 | 50* |
| µ, Electron mobility (cm²/Vs) | 1400 | 800 | 900 |
| V, Maximum velocity ($10^7$ cm/s) | 1 | 2 | 3 |
| Thermal conductivity (W/cm K) | 1.5 | 4.9 | 1.7 |

*theoretical maximum value

Thus, the thicker a semiconductor layer and the lower the dopant concentration in such semiconductor layer, the higher the breakdown voltage of the switching device fabricated by using such semiconductor layer. Therefore, thick, low-doped epitaxial semiconductor layers are required in order to fabricate switching devices that will support high breakdown voltage.

For obtaining a sufficiently high breakdown voltage, the thickness and doping requirements for GaN layers are less than those for Si or SiC layers. Specifically, FIG. 1 is a plot of the predicted doping and thickness requirements for GaN-based rectifiers. For example, in order to fabricate a rectifier with a 5 kV reverse breakdown voltage, an approximately 20 µm thick GaN layer with a background doping concentration of $n=1 \times 10^{16}$ atoms/cm³ is required. AlGaN alloys, which have even larger band gap (6.2 eV max) and higher theoretical breakdown voltage than those of simple GaN material, enable fabrication of rectifiers and other switching devices of even higher breakdown voltages.

In order to fabricate the GaN-based switching devices of high breakdown voltages, as described hereinabove, it is necessary to deposit the thick, low-doped GaN semiconductor layer of required thickness and background doping concentration on top of a highly conductive GaN base layer that is required for ohmic contact.

However, GaN is difficult to deposit to a thickness greater than a couple of microns on hetero-epitaxial substrates, due to high thermal coefficient of expansion (TCE) mismatch and formation of threading dislocations (TDs) and other defects. Novel growth methods, structures, and/or substrates therefore need to be employed to deposit GaN layers to a suitable thickness, as required for fabrication of an electronic device. In addition, the epitaxial layers need to be deposited on a substrate of suitable size, with high uniformity and quality, and with an appropriate configuration of the epitaxial structure (e.g., lateral or vertical) and orientation (e.g., c-plane, r-plane, m-plane, off-axis, on-axis, and offcut direction and angle), so as to meet the cost, yield and performance needs of the specific device applications.

Currently, Si, sapphire, SiC, HVPE/sapphire, and free-standing bulk GaN substrates are available in various sizes and configurations that suit the needs of various high voltage diode applications. Typically, low cost, low power (<1 kV) devices employ a hetero-epitaxial substrate such as Si and sapphire, while high cost, high power (>1 kV) devices use better lattice matched substrates, such as SiC, HVPE/sapphire, and free-standing bulk GaN. Provision of suitable epitaxy quality on hetero-epitaxial substrates is difficult, due to the differences in thermal expansion coefficients and lattice mismatches between the hetero-epitaxial substrates and the GaN layers grown thereon, which result in high dislocation defect density and severe cracking of the GaN epitaxial layers. Growth of epitaxial GaN layer on GaN or HVPE/sapphire substrates are less affected by the TCE and lattice mismatches, but other problems, such as interface charge elimination between the GaN substrates and the epitaxial layer, may still need to be overcome. In all cases, problems with cracking are exacerbated when GaN epitaxial layer is doped with Si to form the highly conductive n-type GaN layer in high breakdown voltage devices.

It is therefore an object of the present invention to provide a high quality and uniform MOVPE epitaxial layer of large diameter on a suitable hetero-epitaxial or homo-epitaxial substrate with low cracking density, low pitting density, and high n-layer conductivity, upon which a thick, low-doped GaN layer can be formed for fabricating GaN-based switching devices with high breakdown voltages.

SUMMARY OF INVENTION

The present invention in one aspect relates to a high voltage breakdown device with good current spreading fabricated on a hetero-epitaxial substrate, such as a sapphire substrate or a SiC or Si substrate of high vertical conductivity. Severe cracking is generally observed in epitaxial GaN layers formed on such hetero-epitaxial substrate, which may be partially suppressed, but not entirely eliminated, by providing high doping levels (>5E18 cm$^{-3}$ and <3E19 cm$^{-3}$) or delta doping in such epitaxial GaN layers.

One embodiment of the present invention therefore employs two highly conductive GaN layers, one of which has a relatively higher doping concentration and the other of which has a relatively lower doping concentration, for further suppression of the cracking in the undoped epitaxial GaN layers subsequently formed thereon.

Another embodiment of the present invention provides an undoped GaN layer underneath the highly conductive GaN layer, which functions to improve material quality and reduce pitting and cracking in the undoped epitaxial GaN layers subsequently formed on such highly conductive GaN layer.

Still another embodiment of the present invention utilizes strain-reducing dopant materials, such as germanium, in place of the conventional Si dopant used for n-type doping of the conductive GaN layer. Since germanium fits in the Ga site better than Si, doping of the conductive GaN layer with germanium significantly reduces cracking therein.

The present invention in another aspect relates to a high voltage breakdown device fabricated on a free-standing homo-epitaxial GaN substrate, or a HVPE/sapphire base structure.

The term "HVPE/sapphire base structure" in the present invention refers to a base structure comprising a device quality, crack free GaN base layer of about 10 μm in thickness fabricated on a sapphire substrate via the hydride vapor phase epitaxy (HVPE) process, as described in U.S. Pat. No. 6,156,581 issued Dec. 5, 2000 in the names of Robert P. Vaudo et al. for "GaN-BASED DEVICES USING THICK (Ga, Al, In)N BASE LAYERS," the content of which has been incorporated herein by reference in its entirety for all purposes.

In one embodiment of the present invention, the free-standing GaN substrate or the HVPE/sapphire base structure comprises an undoped GaN top layer, and subsequent epitaxial growth of GaN layer thereupon is carried out uniformly by eliminating dopant or conductivity at the interface of the epitaxial GaN layer and the substrate or base structure. The quality and performance of such epitaxial GaN layer can be further improved by employing alternative growth orientations, offcut angles, and offcut directions, as described in U.S. Pat. No. 6,447,604 issued Sep. 10, 2002 in the names of Jeffrey S. Flynn et al. for "METHOD FOR ACHIEVING IMPROVED EPITAXY QUALITY (SURFACE TEXTURE AND DEFECT DENSITY) ON FREE-STANDING (ALUMINUM, INDIUM, GALLIUM) NITRIDE ((AL,IN,GA)N) SUBSTRATES FOR OPTO-ELECTRONIC AND ELECTRONIC DEVICES," the content of which is incorporated herein by reference in its entirety for all purposes.

The present invention in a further aspect relates to a microelectronic device that comprises:
  (a) a first conductive GaN interfacial layer having a top surface that is characterized by a dislocation defect density of not more than about 5×10$^6$/cm$^2$;
  (b) a second GaN layer having a dopant concentration of not more than about 1×10$^{16}$/cm$^3$, formed over the top layer of said first conductive GaN base layer; and
  (c) at least one metal contact over said first GaN layer, forming a metal-to-semiconductor junction therewith.

Note that the term "GaN" as used in the present invention, unless specified otherwise, broadly covers any Al$_x$In$_y$Ga$_{(1-x-y)}$N-based materials, which include, but are not limited to, GaN, Al$_x$Ga$_{1-x}$N, Al$_x$In$_y$Ga$_{1-x-y}$N, In$_y$Ga$_{1-y}$N, etc.

The unit for dislocation defect density refers to the number of dislocation defects measured per square centimeter.

The unit for dopant concentration refers to the number of dopant atoms measured per cubic centimeter.

Such microelectronic device is preferably a Schottky diode rectifier, having a Schottky contact and an Ohmic contact.

Another aspect of the present invention relates to a microelectronic device, which comprises:
  (a) a foreign substrate;
  (b) a nucleation buffer layer overlying said foreign substrate;
  (c) a first GaN layer overlying said nucleation buffer layer, said first GaN layer having a dopant concentration of not more than about 1×10$^{16}$/cm$^3$;
  (d) a second, conductive GaN layer overlying said first GaN layer;
  (e) a third GaN layer overlying said second, conductive GaN layer, said third GaN layer having a dopant concentration of not more than about 1×10$^{16}$/cm$^3$; and
  (f) at least one metal contact over said third GaN layer, forming a metal-to-semiconductor junction therewith.

Such microelectronic device is also preferably a Schottky diode rectifier, having a Schottky contact and an Ohmic contact.

Still another aspect of the present invention relates to a microelectronic device structure having:
  (a) a first GaN layer of n-type conductivity, having a top surface characterized by a dislocation defect density of not more than about 5×10$^6$/cm$^2$;
  (b) a second GaN layer having a dopant concentration of not more than about 1×10$^{15}$/cm$^3$, formed over the top layer of said first GaN layer;
  (c) a third GaN layer of p-type conductivity, formed over said second GaN layer; and
  (d) at least one metal contact overlying said third GaN layer.

Such microelectronic device structure is preferably a P-I-N diode, having at least two Ohmic contacts, which include one p-type contact and one n-type contact.

Other aspects, features and embodiments of the invention will be more fully apparent from the ensuing disclosure and appended claims.

BRIEF DESCRIPTION OF THE DRAWINGS

FIG. 1 is a plot of the predicted doping concentration and thickness requirements for GaN-based rectifiers.

FIG. 2A is a schematic view of a GaN-based mesa Schottky diode rectifier, according to one embodiment of the present invention.

FIG. 2B is a schematic view of a GaN-based planar Schottky diode rectifier, according to one embodiment of the present invention.

FIG. 5 shows a free-standing GaN-based Schottky rectifier devoid of foreign substrate, according to one embodiment of the present invention.

FIG. 6A shows a generic view of a group of GaN-based mesa Schottky rectifiers, according to one embodiment of the present invention.

FIG. 6B shows a generic view of a group of GaN-based planar Schottky rectifiers, according to one embodiment of the present invention.

DETAILED DESCRIPTION OF THE INVENTION, AND PREFERRED EMBODIMENTS THEREOF

Figure 3:
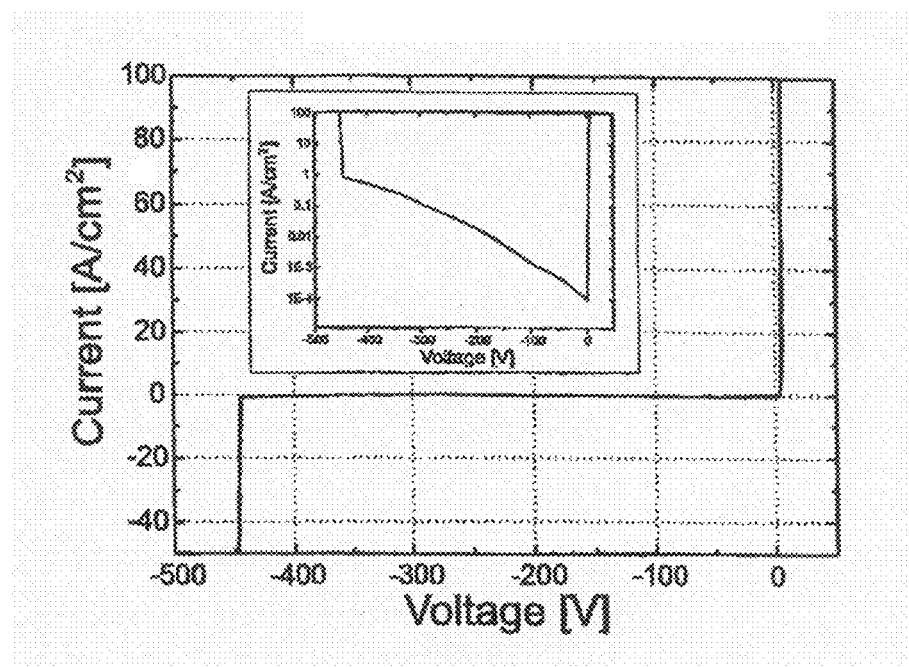
FIG. 3 is the I-V curve for the GaN-based mesa Schottky diode rectifier of FIG. 2A.

For fabricating microelectronic switching devices of relatively low breakdown voltages (i.e., <2 kV), thin GaN layers can be directly deposited by MOVPE on the foreign substrate, such as sapphire, Si, and SiC. Despite the fact that such directly deposited GaN layers are relatively thin (i.e., <10 µm), strain in the GaN layer caused by thermal expansion differences between the foreign substrate and the GaN layers results in significant cracking, pitting and defect production. It is therefore difficult to deposit low-doped GaN layers of this thickness (i.e., <10 µm) on top of thin, conductive GaN layers on foreign substrates for fabricating Schottky rectifiers having breakdown voltages lower than about 2 kV. The following innovative and preferred embodiments address these limitations.

Conductive GaN Base layer Formed Over One or More Interfacial Layers by MOVPE

The present invention provides a conductive GaN base layer of n-type conductivity, which is formed over a foreign substrate, with one or more interfacial layers therebetween for reducing defect density of such conductive GaN base layer.

An Al-containing nucleation buffer layer is first provided on the foreign substrate, prior to the formation of the conductive GaN base layer to ensure proper nucleation of such conductive GaN base layer, since silicon and other impurities used as n-type dopants can interrupt the nucleation and coalescence process during the heteroepitaxial growth.

A thin (i.e., ≈0.1 µm), low-doped (i.e., dopant concentration of not more than $1 \times 10^{16}/cm^3$) GaN layer can be deposited on top of such nucleation buffer layer, prior to the formation of the conductive GaN base layer, to further improve the nucleation result.

FIG. 6A shows a generic view of a mesa-type Schottky diode structure 30 with a conductive GaN base layer 34 formed over a foreign substrate 32 and having a nucleation buffer layer 42 and a thin, low-doped GaN layer 44 therebetween as interfacial layers. A thick, low-doped GaN layer 36 is subsequently formed on the conductive GaN base layer 34 with Schottky contact 38 fabricated thereon, and ohmic contacts 39A and 39B fabricated on the conductive GaN base layer 34.

FIG. 6B shows a generic view of a planar-type Schottky diode structure 30', having similar structures to those of the mesa-type Schottky diode 30 as shown in FIG. 6A, except that the ohmic contacts 39A' and 39B' of the planar Schottky diode 30' are formed directly on the conductive GaN base layer 36'.

For Schottky diode structures with recessed contacts as shown in FIG. 6A, it is advantageous to have a thick, conductive GaN layer 34 (which is doped with Si) for high lateral conductivity and current spreading, low contact resistance and good ohmic contacts, as well as for ease of etching from the top of the structure to prevent undershoot and overshoot of the conductive GaN layer 34 in the etching process. Improved ohmic contacts and conductive GaN layer 34 will improve the I-V characteristics of the Schottky diode. For example, the forward turn-on resistance (slope of forward I-V curve) will be increased with a reduction in resistivity or contact resistance in layer 34. Other benefits in the device can be effectuated by modifying the region of the conductive base layer 34 in closest proximity to the low-doped GaN layer 36. For example, the doping level near the low-doped layer 36 can be designed to produce a desired depletion in the low-doped GaN layer 36. Furthermore, the quality, doping level and defect density of the low-doped layer can be modified to improve the reverse I-V characteristics of such Schottky diode, including breakdown voltage and leakage current.

The following examples of Schottky diodes, which have the generic structure as shown in FIG. 6A, but with varying layer thickness and dopant concentration, demonstrate the effects of layer thickness and dopant concentration on the quality of such diodes:

Structure A

Layer (1)—2.5 µm undoped GaN (or lightly n-type dopant concentration of not more than $1 \times 10^{16}/cm^3$)

Layer (2)—2.0 µm Si-doped conductive GaN ($3 \times 10^{19}/cm^3$)

Layer (3)—0.1 µm undoped GaN (or lightly n-type dopant concentration of not more than $1 \times 10^{16}/cm^3$)

Layer (4)—Nucleation buffer

Layer (5)—Sapphire substrate

This Schottky diode structure A exhibits high pitting and cracking density.

Figure 7A:
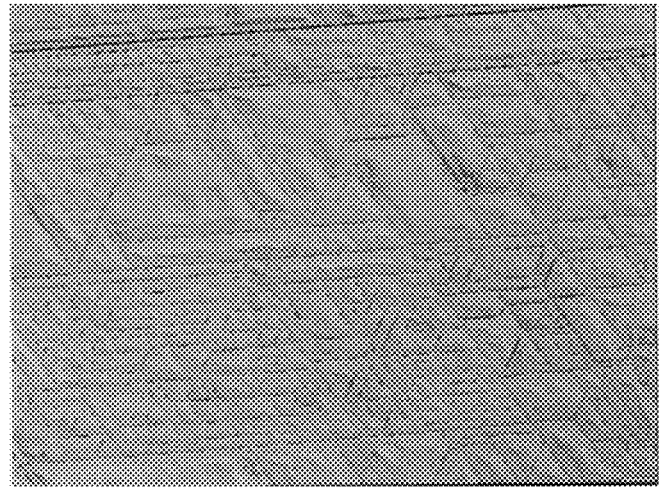
FIG. 7A shows a 32.5X Nomarski view of the center of the nitride material for forming a GaN-based Schottky rectifier, according to one embodiment of the present invention.
Figure 7B:
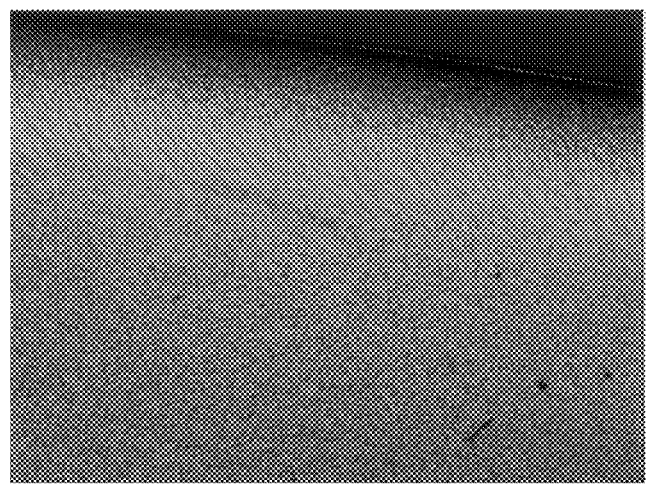
FIG. 7B shows a 32.5X Nomarski view of the edge of the nitride material for forming a GaN-based Schottky rectifier of FIG. 7A.

Structure B
- Layer (1)—2.5 μm undoped GaN (or lightly n-type dopant concentration of not more than $1 \times 10^{16}/cm^3$)
- Layer (2)—1.0 μm Si-doped conductive GaN ($1 \times 10^{19}/cm^3$)
- Layer (3)—0.1 μm undoped GaN (or lightly n-type dopant concentration of not more than $1 \times 10^{16}/cm^3$)
- Layer (4)—Nucleation buffer
- Layer (5)—Sapphire substrate This Schottky diode structure B has a conductive GaN layer of reduced thickness and dopant concentration, in comparison with that of Structure A. Severe cracking and pitting is still observed in this Schottky diode structure B, as shown in FIGS. 7A and 7B.

Figure 8A:
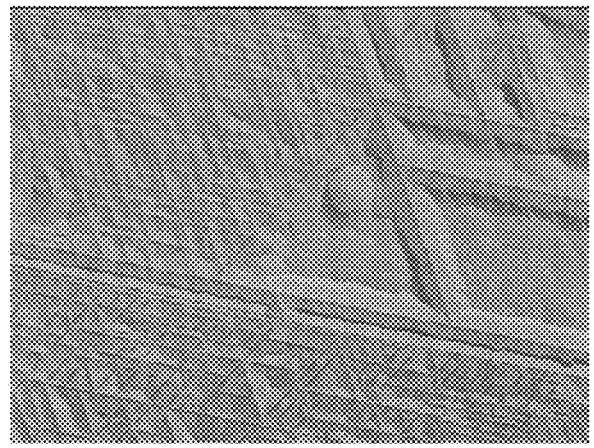
FIG. 8A shows a 32.5X Nomarski view of the center of the nitride material for forming a GaN-based Schottky rectifier, according to one embodiment of the present invention.
Figure 8B:
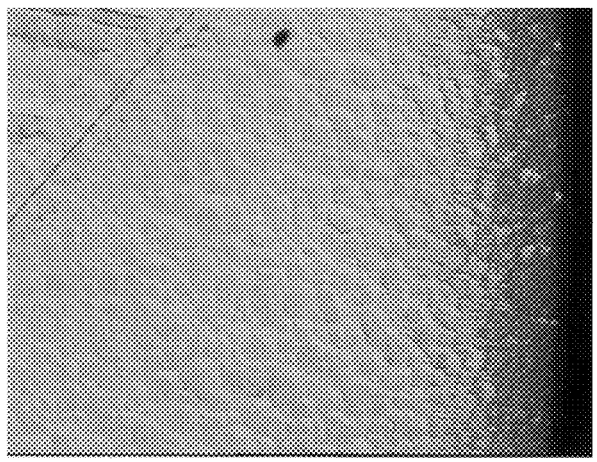
FIG. 8B shows a 32.5X Nomarski view of the edge of the nitride material for forming a GaN-based Schottky rectifier of FIG. 8A.

Structure C
- Layer (1)—2.5 μm undoped GaN (or lightly n-type dopant concentration of not more than $1 \times 10^{16}/cm^3$)
- Layer (2)—2.0 μm Si-doped conductive GaN ($1.5 \times 10^{19}/cm^3$)
- Layer (3)—0.6 μm undoped GaN (or lightly n-type dopant concentration of not more than $1 \times 10^{16}/cm^3$)
- Layer (4)—Nucleation buffer
- Layer (5)—Sapphire substrate This Schottky diode structure C has an undoped or low-doped GaN interfacial layer of increased thickness beneath the conductive GaN layer, in comparison with that of Structure A. Reduced pitting density is observed in this Schottky diode structure C, as shown in FIGS. 8A and 8B.

Figure 9A:
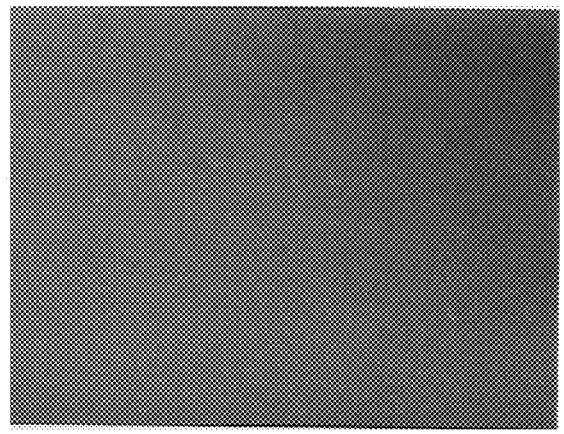
FIG. 9A shows a 32.5X Nomarski view of the center of the nitride material for forming a GaN-based Schottky rectifier, according to one embodiment of the present invention.
Figure 9B:
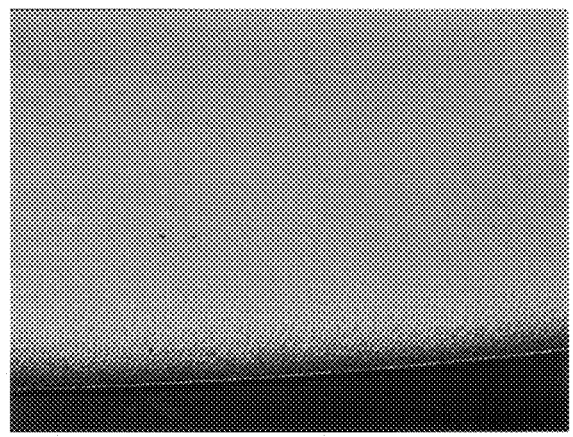
FIG. 9B shows a 32.5X Nomarski view of the edge of the nitride material for forming a GaN-based Schottky rectifier of FIG. 9A.

Structure D
- Layer (1)—2.5 μm undoped GaN (or lightly n-type dopant concentration of not more than $1 \times 10^{16}/cm^3$)
- Layer (2)—0.5 μm Si-doped conductive GaN ($1.5 \times 10^{19}/cm^3$)
- Layer (3)—0.6 μm undoped GaN (or lightly n-type dopant concentration of not more than $1 \times 10^{16}/cm^3$)
- Layer (4)—Nucleation buffer
- Layer (5)—Sapphire substrate This Schottky diode structure D has a conductive GaN layer of reduced thickness and dopant concentration, and an undoped or low-doped GaN interfacial layer of increased thickness beneath the conductive GaN layer, in comparison with those of Structure A. No significant cracking or pitting is observed in such Schottky diode structure D, as shown in FIGS. 9A and 9B.

A composite structure E shown as follows can be devised to provide reduced cracking and pitting quality, while still maintaining low resistivity of the device.

Figure 10:
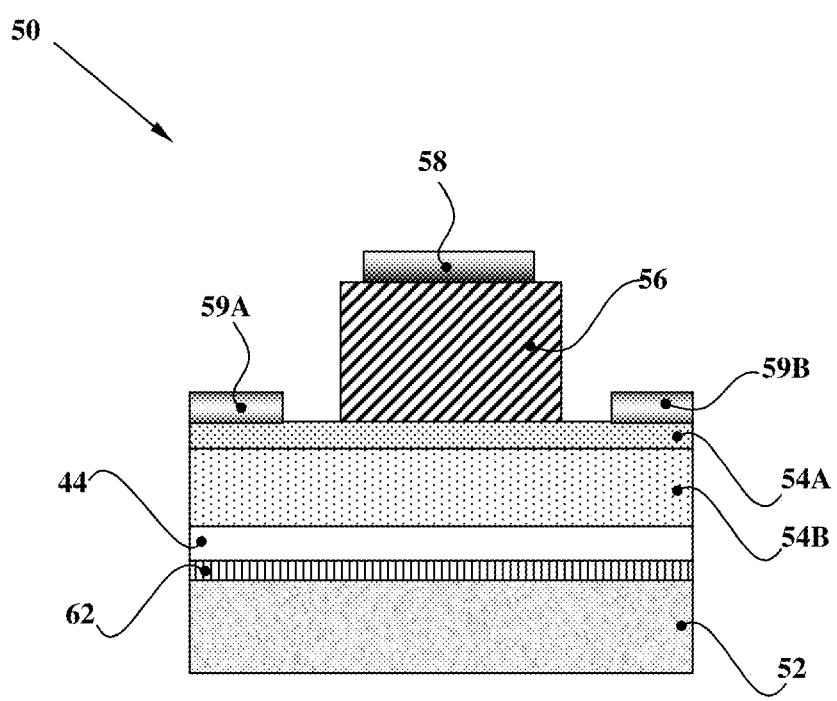
FIG. 10 shows a schematic view of a GaN-based mesa Schottky rectifier, according to one embodiment of the present invention.

Structure E
- Layer (1)—2.5 μm undoped GaN (or lightly n-type dopant concentration of not more than $1 \times 10^{16}/cm^3$)
- Layer (2)—0.1 μm Si-doped conductive GaN sub-layer ($1.5 \times 10^{19}/cm^3$)
- Layer (3)—1.9 μm Si-doped conductive GaN sub-layer ($2 \times 10^{18}/cm^3$)
- Layer (4)—0.6 μm undoped GaN (or lightly n-type dopant concentration of not more than $1 \times 10^{16}/cm^3$)
- Layer (5)—Nucleation buffer
- Layer (6)—Sapphire substrate This Structure E is schematically shown in FIG. 10 (as structure 50 therein), which comprises a first conductive GaN sub-layer 54A of a smaller thickness and a higher dopant concentration, which is adjacent to the contact-forming undoped or low-doped GaN layer 56, and a second conductive GaN sub-layer 54B of a bigger thickness and a lower dopant concentration, which is adjacent to the interfacial undoped or low-doped GaN layer 44. Such Schottky diode structure exhibits a sheet resistance of 36 ohm/square, which is close to the 14 ohm/square sheet resistance of Structure A. Further optimization of the conductive GaN sub-layers and the interfacial undoped or low-doped GaN layer with respect to their thickness and doping level can be implemented to reach the 14 ohm/square, without significantly increasing the cracking or pitting density.

In general, placing a thick, undoped or low-doped GaN interfacial layer underneath the conductive GaN base layer reduces the cracking and pitting in the overall structure. Other interfacial layers or alloys can also be used for strain relief or thermal expansion coefficient (TCE) relief, so as to further reducing the cracking and pitting in the Schottky diode structure formed and to further improve the device quality.

The conductive GaN base layers of n-type conductivity are doped by Si in the above-listed exemplary structures. Alternatively, they can be doped by germanium (Ge) or other n-type dopants with similar atomic size to the AlInGaN atoms, to enable modified elasticity, strain or TCE effects.

Delta doping, as more fully described in U.S. Patent Application Publication No. 2003/0178633 published on Sep. 25, 2003 and U.S. Pat. No. 7,919,791 issued on Apr. 5, 2011 in the names of Jeffrey S. Flynn and George R. Brandes for "DOPED GROUP III-V NITRIDE MATERIALS, AND MICROELECTRONIC DEVICES AND DEVICE PRECURSOR STRUCTURES COMPRISING SAME," the disclosures of which are hereby incorporated by reference in their entireties, can also be incorporated into the doped layers for providing a thick stack of average low resistivity material, as in the conductive sub-layers 54A and 54B of the Schottky diode structure 50 in FIG. 10.

Conductive GaN Base Layer Formed by HVPE

For example, we grew an approximately 10 μm thick GaN layer directly on a sapphire substrate by hydride vapor phase epitaxy (HVPE), which was subsequently used to form a GaN-based Schottky diode, as shown schematically in FIGS. 2A and 2B. The greater thickness are able to be achieved by HVPE compared with MOVPE due to the reduce thermal coefficient of expansion difference, a much thicker and more heavily dislocated buffer and other interfacial defects which result in overall lower strain in the epi layer.

Figure 4:
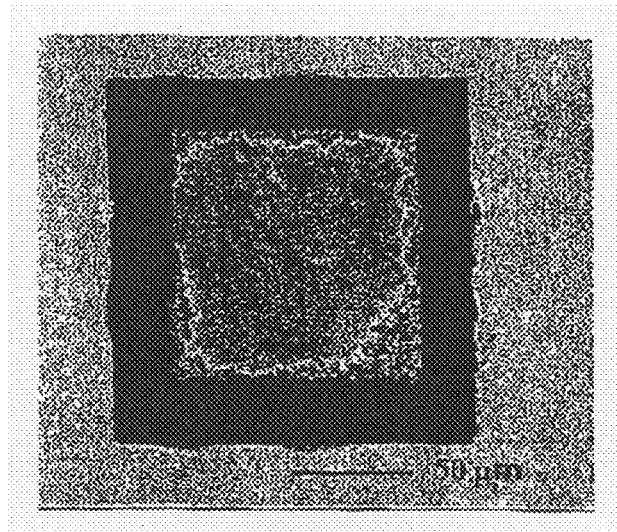
FIG. 4 shows the scanning electron microscopic view of a Schottky contact of the GaN-based mesa Schottky diode rectifier of FIG. 2A after electric breakdown.

The GaN-based mesa-type Schottky diode 10 in FIG. 2A comprises a sapphire substrate 12, a highly conductive GaN layer 14 of n-type conductivity is present at the GaN/sapphire interface, upon which an approximately 10 μm GaN layer 16 of low dopant concentration ($\approx 1 \times 10^{16}/cm^3$) is fabricated. Gold is used for forming the Schottky contact 18, and Ti/Al/Ni/Au is used for forming the ohmic contacts 19A and 19B. The I-V curve for this GaN-based mesa-type Schottky diode is shown in FIG. 3. The reverse breakdown voltage of such GaN-based mesa Schottky diode was measured, which is about 450V. FIG. 4 shows the scanning electron microscopic view of the Schottky contact 18 of the GaN-based mesa Schottky diode in FIG. 2A, after electric breakdown. The melted Au at edges indicates premature edge breakdown, which limits the overall reverse breakdown voltage of such Schottky diode without passivation or use of guard ring or similar steps.

FIG. 2B shows a GaN-based planar Schottky diode 10', having structures similar to those of the mesa diode 10 as shown in FIG. 2A, except that the ohmic contacts 19A' and 19B' (along with Schottky contact 18') of such planar Schottky diode 10' are formed on the 10 μm GaN layer 16' of low dopant concentration instead of on the highly conductive GaN layer 14' that is disposed over the sapphire substrate 12'.

The GaN-based Schottky diodes shown in FIGS. 2A and 2B are therefore only suitable for switching applications at relatively low voltages (i.e., <2 kV). However, many industrial applications require switching devices operable at higher voltages (2 kV). It is therefore another object of the present invention to provide a GaN-based Schottky diode with breakdown voltages higher than about 2 kV.

In order to provide high voltage GaN-based switching devices, it is necessary to provide GaN layers of increased thickness and lower dopant concentration, as shown by the prediction plot of FIG. 1. For GaN layers grown on foreign substrate by MOVPE, the lattice mismatch and the differences in thermal expansion coefficient between the foreign substrate and the GaN layer grown thereon result in high dislocation defect density in such GaN layer with high level of strain. When the thickness of such GaN layer is increased substantially, the strain can cause severe cracking in such GaN layer, rendering it unsuitable for device fabrication.

The present invention also provides a new Schottky diode structure, which comprises a conductive GaN base layer having a top surface of very low dislocation defect density (i.e., $5\times10^6/cm^2$), upon which a low-doped GaN layer having a dopant concentration of not more than about $1\times10^{16}/cm^3$ can be grown. Because the conductive GaN base layer has a top surface of low dislocation defect density, strain-relaxed, low-doped GaN layer thereon can be grown to a sufficient thickness (i.e., ≥10 μm) without cracking, which can be subsequently used for fabricating a switching device of high breakdown voltage.

Free-Standing Conductive GaN Base Layer

A thick, conductive GaN layer of a low dislocation defect density (i.e., $\leq 5\times10^6/cm^2$) can be first grown on a foreign substrate (such as sapphire, Si, or SiC) by hydride vapor phase epitaxy (HVPE) at decreased growth temperature (i.e., from about 985° C. to about 1010° C.). At such decreased HVPE growth temperature, the GaN layer suffers from less strain induced by the thermal expansion coefficient differences between the foreign substrate and the GaN layer, which results in reduced dislocation defect density, as described in U.S. Pat. No. 6,440,823 issued on Aug. 27, 2002 for "LOW DEFECT DENSITY (Ga,Al,In)N AND HVPE PROCESS FOR MAKING SAME," the content of which is incorporated by reference herein in its entirety for all purposes. Such decreased HVPE growth temperature also increases the n-type conductivity of the GaN layer so formed, and therefore can be used to form conductive GaN layer of n-type conductivity. The thick, conductive GaN layer of a low dislocation defect density can be separated from the foreign substrate to produce a free-standing conductive GaN base layer.

Further, the epitaxy quality of such conductive GaN layer can be further improved by various techniques described in U.S. Pat. No. 6,447,604 issued Sep. 10, 2002 in the names of Jeffrey S. Flynn et al. for "METHOD FOR ACHIEVING IMPROVED EPITAXY QUALITY (SURFACE TEXTURE AND DEFECT DENSITY) ON FREE-STANDING (ALUMINUM, INDIUM, GALLIUM) NITRIDE ((AL,IN,GA)N) SUBSTRATES FOR OPTO-ELECTRONIC AND ELECTRONIC DEVICES," the content of which is incorporated by reference herein in its entirety for all purposes. Low temperature interfacial layers, alternative crystal orientations (e.g., m-plane, r-plane, c-plane), and various offcut angles and directions are preferably employed to modify crystal growth quality, annihilate defects, modify point defect density, modify impurity incorporation, change crystal polarization, modify crystal mobility, increase breakdown voltage, reduce leakage current, etc., as described in the U.S. Pat. No. 6,447,604, for further improvement of the epitaxy quality of such conductive GaN layer and the performance of high breakdown voltage devices.

The free-standing GaN substrate can be usefully employed to provide an initial undoped GaN layer, the growth of which can then be continued in a MOVPE growth process for further increase of thickness, reduction of dislocation density, and improvement of the breakdown voltage. For such continued growth of the undoped GaN layer through MOVPE, it is important that the electrically active impurities and defects are reduced at the growth interface, by appropriately controlling the cleaning of the substrate, the heat-up conditions, and nucleation on the substrate, as described in the U.S. Pat. No. 6,447,604.

FIG. 5 shows a schematic view of a high voltage Schottky rectifier 20, according to one embodiment of the present invention. Such Schottky rectifier 20 comprises a free-standing, conductive GaN base layer 22 having a thickness of greater than about 50 μm and a top surface characterized by a low dislocation defect density of not more than about $5\times10^6/cm^2$. A low-doped GaN layer 24 grown thereupon, which is characterized by a dopant concentration of not more than about $1\times10^{16}/cm^3$ and a thickness of greater than about 10 μm. Such Schottky rectifier 20 is devoid of any foreign substrate, so the Schottky contact 26 can be formed over the low-doped GaN layer 24 at one side, and the ohmic contact 28 can be formed over the free-standing, conductive GaN base layer 22 at the opposite side.

GaN-Based P-N and P-I-N Diode Structures

GaN-based P-N and P-I-N diodes with high breakdown voltages are also of interest for high power device applications. The ability to fabricate PN or P-I-N junctions with high breakdown voltages is a key step toward the development of power devices such as thyristors and IMPATTs.

The present invention in one aspect provides GaN P-I-N diodes with breakdown voltages of about 320V and 450V, which were fabricated by growing the GaN-based P and I layers by MOVPE on an HVPE GaN layer with a highly conductive n-type GaN layer near the epilayer/substrate interface. Alternative P-N and P-I-N structures including AlGaN P-I-N structures and the use of GaN as the substrate material for the epitaxy and device are also contemplated by the present invention.

Figure 11:
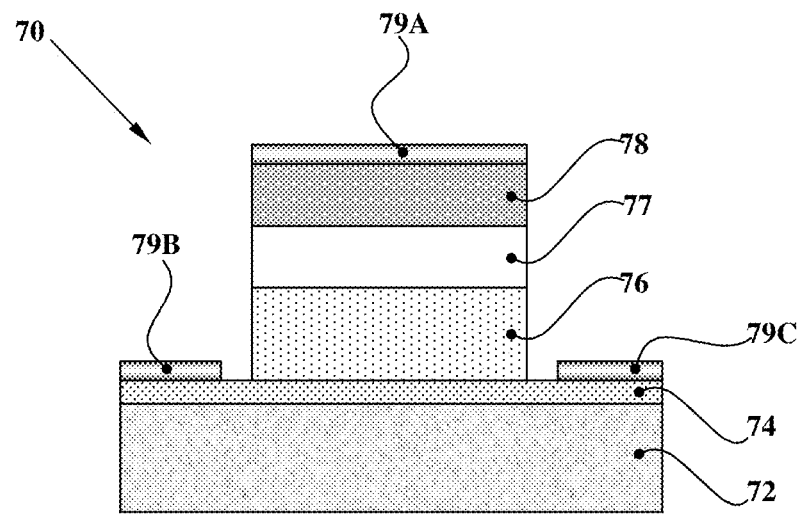
FIG. 11 shows a schematic view of a GaN-based P-I-N diode, according to one embodiment of the present invention.

A schematic GaN P-I-N diode structure 70 is shown in FIG. 11, which comprises an approximately 10 μm thick GaN layer of n-type conductivity grown by HVPE on a sapphire substrate 72. Such n-type GaN layer can be viewed as further comprising a higher conductive 2 μm GaN sub-layer 74 and a less conductive 8 μm GaN sub-layer 76 having a conductivity of about $1\times10^{16}/cm^3$, which functions as the N-junction. An approximately 0.5 μm low-doped GaN layer 77 is subsequently grown on the GaN sub-layer 76 by MOVPE, under conditions which result in a background dopant concentration of less than $1\times10^{15}/cm^3$, which functions as the I-junction. An approximately 0.5 μm p-type GaN layer 78 is grown on the low-doped GaN layer 77 by MOVPE, under conditions which result in a hole concentration of about $1\times10^{17}/cm^3$, which functions as the P-junction. P-type ohmic contact 79A and n-type ohmic contacts 79B and 79C are subsequently formed, so as to provide a complete P-I-N diode.

Figure 12:
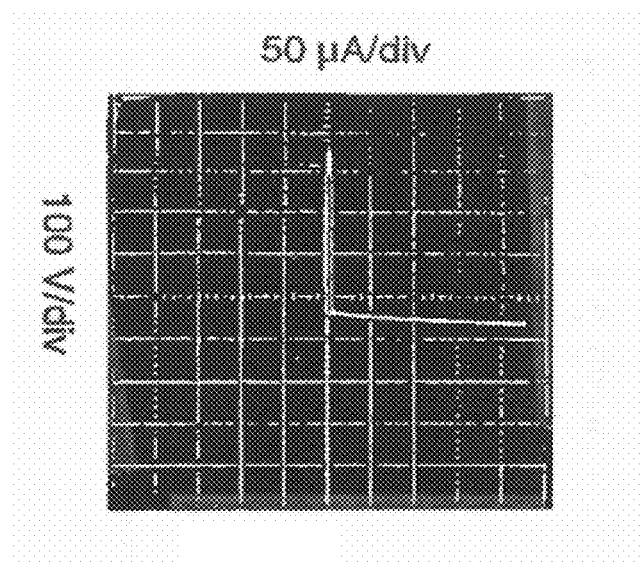
FIG. 12 shows the I-V curve for the GaN-based P-I-N diode of FIG. 11.

P-I-N diode structure of this type is formed by reactive ion etching, to provide a mesa-structure as that shown in FIG. 11, and standard metallization procedures to provide the p-type and n-type ohmic contacts. The I-V curve for such P-I-N diode structure is shown in FIG. 12. A breakdown voltage of approximately 320V was measured in this P-I-N device. A breakdown voltage of 450V was obtained in another P-I-N diode of similar structure. In both cases, the devices exhibited premature breakdown at the corners and edges, indicating that the device was not limited by material quality, rather the device design.

P-N or P-I-N diodes of higher breakdown voltages can be fabricated using improved edge termination and thicker I-layers. The thickness of the GaN layers in the P-I-N structures was limited by strain-induced cracking, which has been observed in GaN layers grown on foreign substrate, such as sapphire, when the thickness of such GaN layers becomes greater than approximately 10 μm, as described hereinabove in the section relating to GaN-based Schottky diode structure. The free-standing, low dislocation defect density GaN layer as described for the Schottky diode structure can also be used for fabricating high voltage P-N or P-I-N diode structure.

Specifically, the techniques for producing low dislocation defect density, free-standing GaN substrates were disclosed in U.S. Pat. No. 6,440,823 issued on Aug. 27, 2002 for "LOW DEFECT DENSITY (Ga,Al,In)N AND HVPE PROCESS FOR MAKING SAME," U.S. Patent Application Publication No. 2001/0008656 in the names of Michael A. Tischler, Thomas F. Kuech and Robert P. Vaudo for "BULK SINGLE CRYSTAL GALLIUM NITRIDE AND METHOD OF MAKING THE SAME," U.S. Pat. No. 5,679,152 issued Oct. 21, 1997; and U.S. Pat. No. 6,156,581 issued Dec. 5, 2000 for "GAN-BASED DEVICES USING (GA, AL, IN)N BASE LAYERS."

Figure 13:
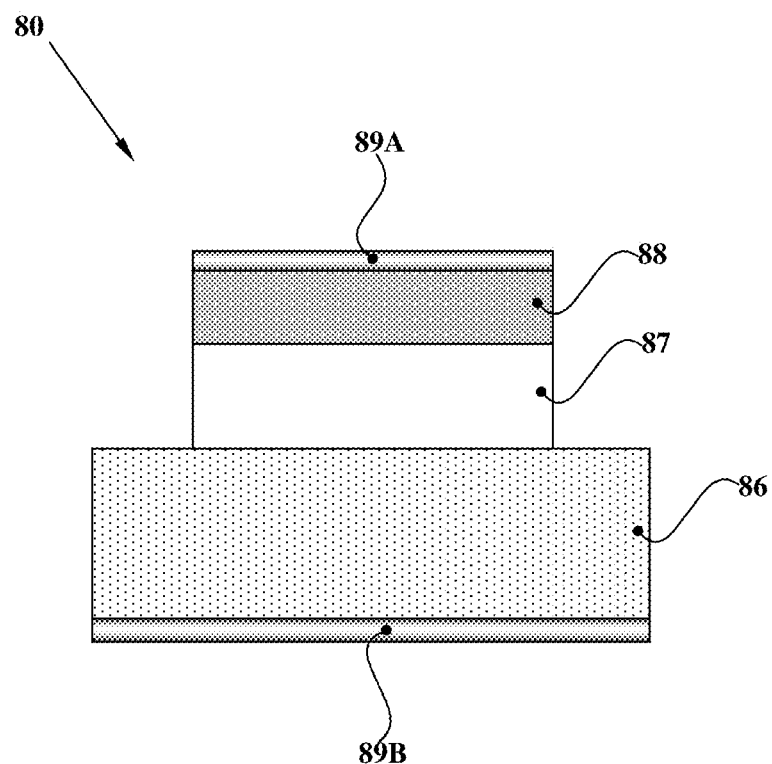
FIG. 13 shows a schematic view of a free-standing, GaN-based P-I-N diode, according to one embodiment of the present invention.

A schematic view of a high voltage P-I-N structure 80 of the present invention is shown in FIG. 13, which includes a N-junction formed by a free-standing, conductive GaN base layer 86 of n-type conductivity, characterized by a dislocation defect density of not more than $5 \times 10^6/cm^2$ and a preferred thickness of more than about 50 μm. Such low dislocation defect density, free standing GaN base layer is formed by methods similar to those described hereinabove for the Schottky diode structure. An I-junction comprising a thick, low-doped GaN layer 87 having a dopant concentration of not more than $1 \times 10^{15}/cm^3$ are formed upon such conductive GaN base layer 86. The GaN base layer 86 can be removed from the foreign substrate upon which it is formed, either prior to or after formation of the low-doped GaN layer 87. Since the conductive GaN base layer 86 has a low dislocation defect density, the low-doped GaN layer 87 formed thereon can be grown to a sufficient thickness, i.e., more than 10 μm, for enhancing the overall breakdown voltage of the P-I-N structure 80. A P-junction comprising a GaN layer 88 of p-type conductivity and above 0.25 μm in thickness can be subsequently formed over the low-doped GaN layer 87.

The p-type ohmic contact 89A can be formed over the p-type GaN layer 88, while the n-type ohmic contact 89B can be formed over the n-type conductive GaN base layer 86, and the thickness of the I-layer 87 can be extended to thickness >10 μm, for increasing the breakdown voltage. A vertical structure as shown in FIG. 13 is advantageous because it minimizes current crowding in the n-type layer, as opposed to the lateral device shown in FIG. 11. Reduced dislocation defect density in the n-type conductive GaN layer 86 also leads to reduced leakage currents in the device.

P-I-N diode structure which contain (Al,Ga)N or (Al,Ga,In)N alloys can also be fabricated. For example, the use of AlGaN, which has a wider band gap than GaN, may lead to higher break-down voltages and the ability to use thinner, low-doped layers in the device structure.

The P-N and P-I-N diode technology described in the present invention can be used to fabricate more complex bipolar GaN-based power devices such as thyristors (p-n-p-n) and IMPATTs ($n^+$-p-i-$p^+$).

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A microelectronic device structure, comprising:
   a first GaN layer having a top surface characterized by a dislocation defect density of not more than $5 \times 10^6/cm^2$;
   a second, conductive GaN layer overlying said first GaN layer;
   a third GaN layer overlying said second, conductive GaN layer, said third GaN layer having a dopant concentration of not more than $1 \times 10^{16}/cm^3$ and a thickness of at least 2.5 μm; and
   at least one metal contact over said third GaN layer, forming a metal-to-semiconductor junction therewith.

2. The microelectronic device structure of claim 1, having a breakdown voltage of at least 320V.

3. The microelectronic device structure of claim 1, further comprising a substrate, wherein the first GaN layer is overlying the substrate.

4. The microelectronic device structure of claim 3, wherein the substrate comprises a foreign substrate, and the microelectronic device structure further comprises a nucleation buffer layer disposed between the first GaN layer and the foreign substrate.

5. The microelectronic device structure of claim 4, wherein the foreign substrate comprises a material selected from the group consisting of sapphire, Si, and SiC.

6. The microelectronic device structure of claim 1, wherein the third GaN layer is less than 20 μm in thickness.

7. The microelectronic device structure of claim 1, wherein the third GaN layer is less than 50 μm in thickness.

8. The microelectronic device structure of claim 1, wherein the second, conductive GaN layer is doped with a dopant for strain relaxation.

9. The microelectronic device structure of claim 1, wherein the second, conductive GaN layer is doped with germanium.

10. The microelectronic device structure of claim 1, wherein the first GaN layer has a thickness of about 0.6 μm, and wherein the second, conductive GaN layer has a thickness of from about 0.5 μm to about 2 mm and has a dopant concentration of about $1.5 \times 10^{19}/cm^3$.

11. The microelectronic device structure of claim 1, wherein the second, conductive GaN layer comprises a first conductive GaN sub-layer of a first dopant concentration and comprises a second GaN sub-layer of a second dopant concentration, wherein said first conductive GaN sub-layer is adjacent to the first GaN layer, wherein said second conductive GaN sub-layer is adjacent to the third GaN layer, and wherein the first dopant concentration is lower than said second dopant concentration.

12. The microelectronic device structure of claim 1, comprising a Schottky diode selected from the group consisting of mesa-type Schottky diodes and planar-type Schottky diodes.

13. A microelectronic device structure comprising:
   a first GaN layer having a top surface characterized by a dislocation defect density of not more than $5 \times 10^6/cm2$;
   a second GaN layer having a dopant concentration of not more than $1 \times 10^{15}/cm^3$ and a thickness of more than 10 μm formed over said first GaN layer;
   a third GaN layer of p-type conductivity, formed over said second GaN layer; and
   at least one metal contact overlying said third GaN layer.

14. The microelectronic device structure of claim 13, wherein the first GaN layer is of n-type conductivity.

15. The microelectronic device structure of claim 13, wherein the first GaN layer comprises a free-standing GaN structure.

16. The microelectronic device structure of claim 13, comprising a Schottky diode selected from the group consisting of mesa-type Schottky diodes and planar-type Schottky diodes.

17. A microelectronic device structure, comprising:
(a) a first GaN layer;
(b) a second GaN layer of n-type conductivity, overlying said first GaN layer;
(c) a third GaN layer overlying said second GaN layer of n-type conductivity, said third GaN layer having a dopant concentration of not more than about $1\times10^{16}/cm^3$ and a thickness of at least about 2.5 μm;
(d) a fourth GaN layer of p-type conductivity, formed over said third GaN layer; and
(e) at least one metal contact overlying said fourth GaN layer.

18. The microelectronic device structure of claim 17, wherein the first GaN layer has a dopant concentration of not more than about $1\times10^{16}/cm^3$.

19. The microelectronic device structure of claim 17, wherein the first GaN layer has a top surface characterized by a dislocation defect density of not more than $5\times10^6/cm^2$.

20. The microelectronic device structure of claim 17, further comprising a substrate, wherein the first GaN layer is overlying the substrate.

21. The microelectronic device structure of claim 20, wherein the substrate comprises a foreign substrate, and the microelectronic device structure further comprises a nucleation buffer layer disposed between the first GaN layer and the foreign substrate.

22. The microelectronic device structure of claim 21, wherein said foreign substrate comprises a material selected from the group consisting of sapphire, Si, and SiC.

23. The microelectronic device structure of claim 17, wherein the third GaN layer is less than 20 μm in thickness.

24. The microelectronic device structure of claim 17, wherein the third GaN layer is less than 50 μm in thickness.

25. The microelectronic device structure of claim 17, wherein the second GaN layer of n-type conductivity is doped with a strain-reducing dopant.

26. The microelectronic device structure of claim 17, wherein the second GaN layer of n-type conductivity is doped with germanium.

27. The microelectronic device structure of claim 17, wherein the first GaN layer has a thickness of about 0.6 μm, and wherein the second, conductive GaN layer has a thickness of from about 0.5 μm to about 2 mm and has a dopant concentration of about $1.5\times10^{19}/cm^3$.

28. The microelectronic device structure of claim 17, wherein the second, conductive GaN layer comprises a first conductive GaN sub-layer of a first dopant concentration and comprises a second GaN sub-layer of a second dopant concentration, wherein said first conductive GaN sub-layer is adjacent to the first GaN layer, wherein said second conductive GaN sub-layer is adjacent to the third GaN layer, and wherein the first dopant concentration is lower than said second dopant concentration.

29. The microelectronic device structure of claim 17, comprising a Schottky diode selected from the group consisting of mesa-type Schottky diodes and planar-type Schottky diodes.

* * * * *